United States Patent
Imai et al.

(10) Patent No.: US 11,467,700 B2
(45) Date of Patent: Oct. 11, 2022

(54) ELECTROSTATIC SENSOR, CONTROL DEVICE, AND NON-TRANSITORY COMPUTER-READABLE MEDIUM

(71) Applicant: KABUSHIKI KAISHA TOKAI RIKA DENKI SEISAKUSHO, Aichi (JP)

(72) Inventors: Takao Imai, Aichi (JP); Katsuhiro Tsuchiya, Aichi (JP); Shingo Yuasa, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 0 days.

(21) Appl. No.: 17/331,767

(22) Filed: May 27, 2021

(65) Prior Publication Data
US 2021/0397299 A1    Dec. 23, 2021

(30) Foreign Application Priority Data
Jun. 19, 2020    (JP) .............................. JP2020-106256

(51) Int. Cl.
*G06F 3/044* (2006.01)
(52) U.S. Cl.
CPC .......... *G06F 3/0443* (2019.05); *G06F 3/0444* (2019.05); *B60K 2370/143* (2019.05)
(58) Field of Classification Search
CPC ........... G06F 3/041–047; G06F 3/0418; G06F 3/04186; G06F 3/0416; G06F 2203/04104; G06F 3/0446; G06F 3/044; G06F 3/04166; G06F 3/0488; G06F 3/0412; G06F 2203/04111; G06F 3/03545; G06F 3/04182; G06F 2203/04101; G06F 3/03547; G06F 3/0445; H03K 2217/94026
See application file for complete search history.

(56) References Cited

U.S. PATENT DOCUMENTS 9,024,913 B1    5/2015 Jung et al.
2015/0330931 A1*  11/2015 Fujikawa .............. G01N 27/22
324/663

FOREIGN PATENT DOCUMENTS

JP    2015-210811    11/2015

* cited by examiner

*Primary Examiner* — Sanjiv D. Patel
(74) *Attorney, Agent, or Firm* — Greenblum & Bernstein, P.L.C.

(57) ABSTRACT

A detection device is configured to detect an electrostatic capacitance between an operated member having a plurality of detection areas and an electrode having areas associated with the detection areas respectively. A control device is configured to determine whether an operation is performed to each of the detection areas based on whether a difference between the electrostatic capacitance and a reference electrostatic capacitance exceeds a threshold range, and to change the reference electrostatic capacitance based on a change in the electrostatic capacitance. The control device holds the reference electrostatic capacitance in a case where different changes in the electrostatic capacitance are detected between the detection areas.

9 Claims, 4 Drawing Sheets

ELECTROSTATIC SENSOR, CONTROL DEVICE, AND NON-TRANSITORY COMPUTER-READABLE MEDIUM

FIELD

The presently disclosed subject matter relates to an electrostatic sensor equipped with an operated member (a member to be operated) having a plurality of detection areas. The presently disclosed subject matter also relates to a control device configured to control an operation of the electrostatic sensor, as well as a non-transitory computer-readable medium having stored a computer program adapted to be executed by a processor of the control device.

BACKGROUND

Japanese Patent Publication No. 2015-210811A discloses an electrostatic sensor. In the electrostatic sensor, a pseudo capacitor is formed by an approach of a finger or the like of a user to an operated member located in an electric field generated by an electrode, so that an electrostatic capacitance between the electrode and the operated member is increased. When the increase in the electrostatic capacitance is detected, it is determined whether an operation with respect to the operated member is performed by the user.

SUMMARY

Technical Problem

It is demanded to improve the operability of an electrostatic sensor equipped with an operated member having a plurality of detection areas.
Solution to Problem
In order to meet the demand described above, a first illustrative aspect of the presently disclosed subject matter provides an electrostatic sensor, comprising:
 a detection device configured to detect an electrostatic capacitance between an operated member having a plurality of detection areas and an electrode having areas associated with the detection areas respectively; and
 a control device configured to determine whether an operation is performed to each of the detection areas based on whether a difference between the electrostatic capacitance and a reference electrostatic capacitance exceeds a threshold range, and to change the reference electrostatic capacitance based on a change in the electrostatic capacitance,
 wherein the control device holds the reference electrostatic capacitance in a case where different changes in the electrostatic capacitance are detected between the detection areas.

In order to meet the demand described above, a second illustrative aspect of the presently disclosed subject matter provides a control device configured to control an operation of an electrostatic sensor equipped with an operated member having a plurality of detection areas, comprising:
 a reception interface configured to receive detection information corresponding to an electrostatic capacitance between the operated member and an electrode having areas associated with the detection areas respectively; and
 a processor configured to determine whether an operation is performed to each of the detection areas based on whether a difference between the electrostatic capacitance and a reference electrostatic capacitance exceeds a threshold range, and to change the reference electrostatic capacitance based on a change in the electrostatic capacitance,
 wherein the processor holds the reference electrostatic capacitance in a case where different changes in the electrostatic capacitance are detected between the detection areas.

In order to meet the demand described above, a third illustrative aspect of the presently disclosed subject matter provides a non-transitory computer-readable medium having stored a computer program adapted to be executed by a processor of a control device configured to control an operation of an electrostatic sensor equipped with an operated member having a plurality of detection areas, the computer program is configured to cause, when executed, the control device to:
 receive detection information corresponding to an electrostatic capacitance between the operated member and an electrode having areas associated with the detection areas respectively;
 determine whether an operation is performed to each of the detection areas based on whether a difference between the electrostatic capacitance and a reference electrostatic capacitance exceeds a threshold range;
 change the reference electrostatic capacitance based on a change in the electrostatic capacitance; and
 hold the reference electrostatic capacitance in a case where different changes in the electrostatic capacitance are detected between the detection areas.

With the configuration according to each of the first to third illustrative aspects, it is possible to distinguish between a change in the electrostatic capacitance detected in accordance with a fluctuation in the parasitic capacitance caused by an environmental factor such as temperature or humidity and a change in the electrostatic capacitance detected in accordance with noise. Since the fluctuation in the parasitic capacitance caused by the environmental factor generally affects a plurality of detection areas in a similar manner, changes in the electrostatic capacitance of the plurality of detection areas to be detected exhibit a similar tendency. On the other hand, since noise rarely affects a plurality of detection areas in a similar manner, changes in the electrostatic capacitance of the plurality of detection areas to be detected are generally different from each other. In such a case, by holding the value of the reference electrostatic capacitance, it is possible to suppress the occurrence of a situation that an inappropriate reference electrostatic capacitance is set based on a change in the electrostatic capacitance caused by noise, so that the determination as to whether an operation is performed is inaccurately made. Accordingly, it is possible to improve the operability of the electrostatic sensor equipped with the operated member having a plurality of detection areas.

In order to meet the demand described above, a fourth illustrative aspect of the presently disclosed subject matter provides an electrostatic sensor, comprising:
 a detection device configured to detect an electrostatic capacitance between an operated member having a plurality of detection areas and an electrode having areas associated with the detection areas respectively; and
 a control device configured to determine whether an operation is performed to each of the detection areas based on whether a difference between the electrostatic capacitance and a reference electrostatic capacitance exceeds a threshold range, and to change the reference electrostatic capacitance based on a change in the electrostatic capacitance, wherein the control device changes the reference electrostatic capacitance for one of the detection areas in a case where a change in the electrostatic capacitance involving a change in the reference electrostatic capacitance is detected for another one of the detection areas while it is determined that an operation is performed to the one of the detection areas.

In order to meet the demand described above, a fifth illustrative aspect of the presently disclosed subject matter provides a control device configured to control an operation of an electrostatic sensor equipped with an operated member having a plurality of detection areas, comprising:

a reception interface configured to receive detection information corresponding to an electrostatic capacitance between the operated member and an electrode having areas associated with the detection areas respectively; and a processor configured to determine whether an operation is performed to each of the detection areas based on whether a difference between the electrostatic capacitance and a reference electrostatic capacitance exceeds a threshold range, and to change the reference electrostatic capacitance based on a change in the electrostatic capacitance, wherein the processor changes the reference electrostatic capacitance for one of the detection areas in a case where a change in the electrostatic capacitance involving a change in the reference electrostatic capacitance is detected for another one of the detection areas while it is determined that an operation is performed to the one of the detection areas.

In order to meet the demand described above, a sixth illustrative aspect of the presently disclosed subject matter provides a non-transitory computer-readable medium having stored a computer program adapted to be executed by a processor of a control device configured to control an operation of an electrostatic sensor equipped with an operated member having a plurality of detection areas, the computer program is configured to cause, when executed, the control device to:

receive detection information corresponding to an electrostatic capacitance between the operated member and an electrode having areas associated with the detection areas respectively;

determine whether an operation is performed to each of the detection areas based on whether a difference between the electrostatic capacitance and a reference electrostatic capacitance exceeds a threshold range;

change the reference electrostatic capacitance based on a change in the electrostatic capacitance; and change the reference electrostatic capacitance for one of the detection areas in a case where a change in the electrostatic capacitance involving a change in the reference electrostatic capacitance is detected for another one of the detection areas while it is determined that an operation is performed to the one of the detection areas.

The change in the electrostatic capacitance involving the change in the reference electrostatic capacitance means a change in the electrostatic capacitance detected in accordance with a fluctuation in the parasitic capacitance caused by an environmental factor such as temperature or humidity. Since the fluctuation in the parasitic capacitance caused by the environmental factor generally affects a plurality of detection areas in a similar manner, changes in the electrostatic capacitance of the plurality of detection areas to be detected exhibit a similar tendency. Accordingly, the change in the reference electrostatic capacitance for the certain detection area that is made to compensate for the change in the electrostatic capacitance caused by the fluctuation in the parasitic capacitance can be similarly applied to another detection area.

With the configuration according to each of the fourth to sixth illustrative aspects, even if a fluctuation in the parasitic capacitance is caused by the environmental factor such as temperature or humidity while an operation is performed to one of the detection areas, it is possible to set an appropriate reference electrostatic capacitance for the one detection area. In other words, it is possible to suppress the occurrence of a situation that an appropriate reference electrostatic capacitance is not set because of the fluctuation in the parasitic capacitance occurred while an operation is performed to the one detection area, so that determination as to whether a next operation is performed is inaccurately made. Accordingly, it is possible to improve the operability of the electrostatic sensor equipped with the operated member having a plurality of detection areas.

DESCRIPTION OF EMBODIMENTS

Figure 1:
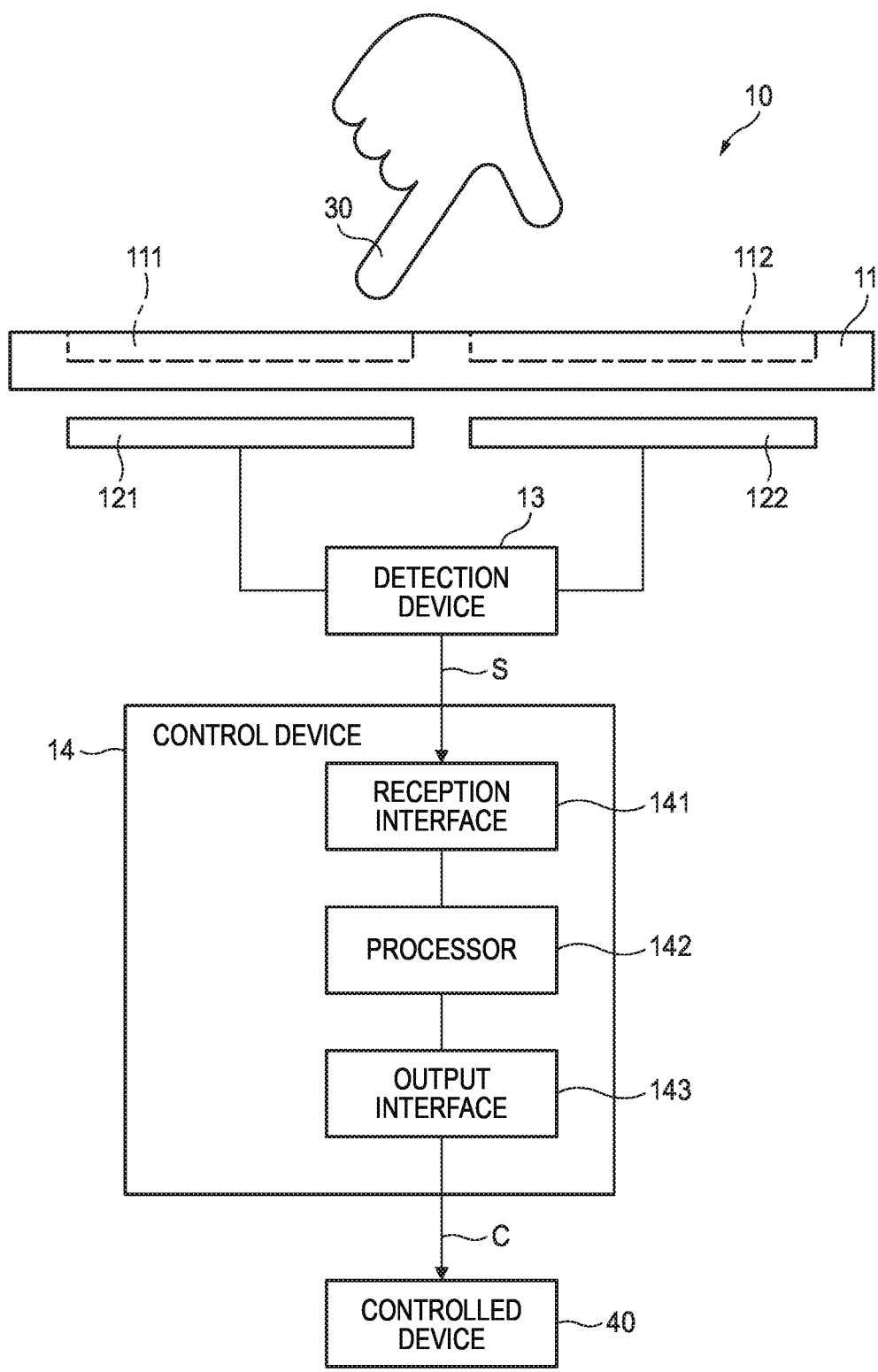
FIG. 1 illustrates a configuration of an electrostatic sensor according to an embodiment.

Examples of embodiments will be described in detail below with reference to the accompanying drawings. FIG. 1 illustrates a functional configuration of an electrostatic sensor 10 according to an embodiment.

Figure 2:
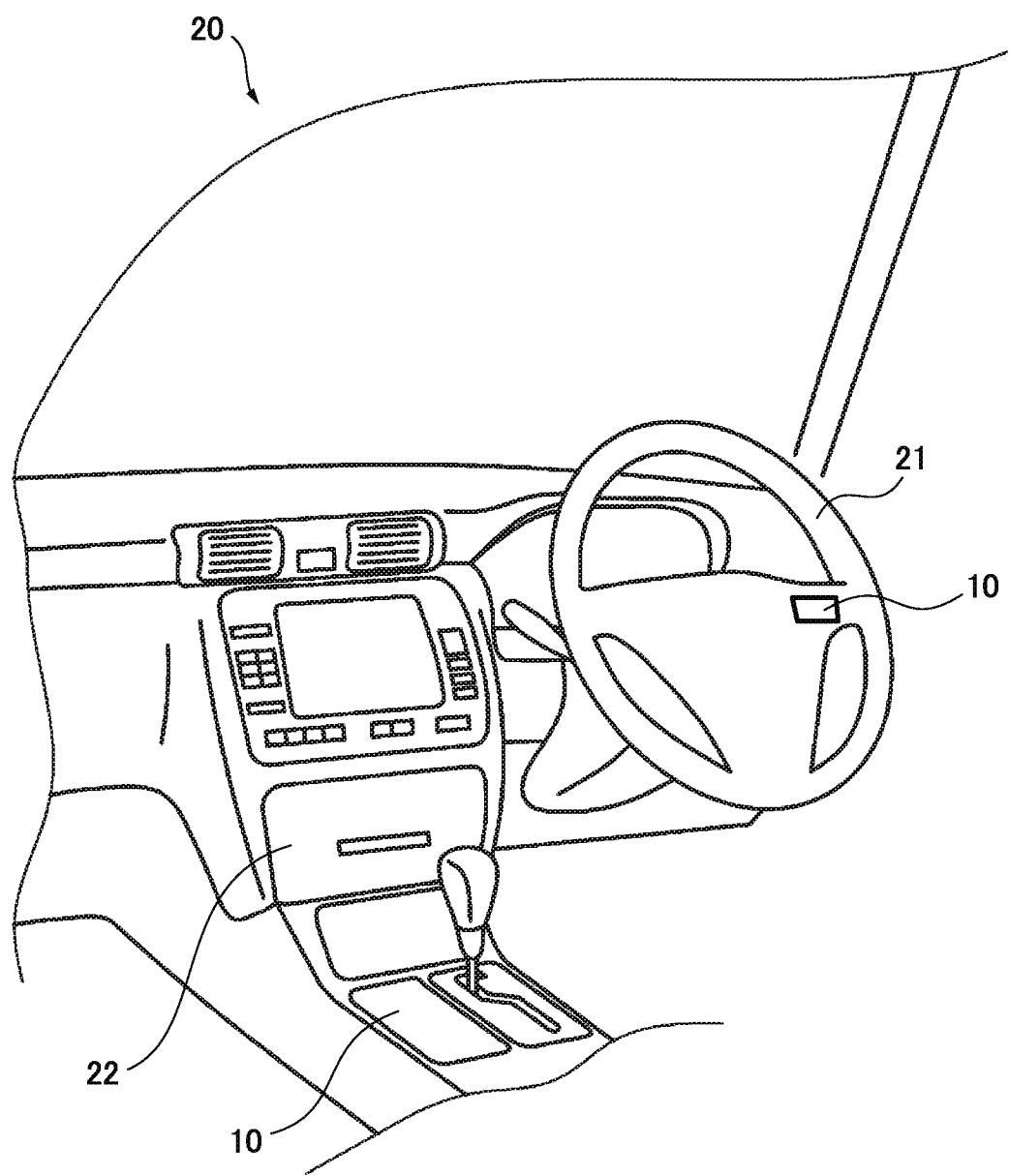
FIG. 2 illustrates a vehicle in which the electrostatic sensor of FIG. 1 is to be installed.

As illustrated in FIG. 2, the electrostatic sensor 10 is configured to be installed in a vehicle 20. For example, the electrostatic sensor 10 may be disposed on a steering wheel 21 or a center cluster 22 in a vehicle cabin of the vehicle 20. The electrostatic sensor 10 is configured to accept an operation performed by an occupant of the vehicle 20, and to remotely operate a controlled device installed in the vehicle 20 based on the operation. Examples of the controlled device include an air conditioner, a lighting device, an audio-visual equipment, a power windows driving device, and a seat control device. The vehicle 20 is an example of the mobile entity.

As illustrated in FIG. 1, the electrostatic sensor 10 includes an operated member 11. The operated member 11 is configured to accept an operation performed with a finger 30 of an occupant of the vehicle 20.

The operated member 11 has a first detection area 111 and a second detection area 112. Each of the first detection area 111 and the second detection area 112 is an area capable of accepting an operation performed with the finger 30 for enabling a specific function of the controlled device 40.

The electrostatic sensor 10 includes a first electrode 121 and a second electrode 122. The first electrode 121 has an area associated with the first detection area 111 of the operated member 11. The second electrode 122 has an area associated with the second detection area 112 of the operated member 11.

The electrostatic sensor 10 includes a detection device 13. The detection device 13 is configured to detect an electrostatic capacitance between the operated member 11 and the first electrode 121. The detection device 13 is configured to detect an electrostatic capacitance between the operated member 11 and the second electrode 122.

Specifically, the detection device 13 includes a charging/discharging circuit. The charging/discharging circuit can perform a charging operation and a discharging operation. The charging/discharging circuit during the charging operation supplies current supplied from a power source (not illustrated) to the first electrode 121 and the second electrode 122. The charging/discharging circuit causes each electrode to emit current during the discharging operation. An electric field is generated around the operated member 11 by the current supplied to each electrode. As the finger 30 approaches this electric field, a pseudo capacitor is formed between a particular electrode and the finger 30. As a result, the electrostatic capacitance between the specific electrode and the operated member 11 is increased. As the electrostatic capacitance increases, the current emitted from the particular electrode during the discharging operation increases.

The detection device 13 is configured to output detection information S corresponding to the detected electrostatic capacitance between each electrode and the operated member 11. The detection information S may be in the form of analog data or may be in the form of digital data.

The electrostatic sensor 10 includes a control device 14. The control device 14 includes a reception interface 141, a processor 142, and an output interface 143.

The reception interface 141 is configured as an interface for receiving the detection information S outputted from the detection device 13. In a case where the detection information S is in the form of analog data, the reception interface 141 is configured to be equipped with an appropriate conversion circuit including an A/D converter.

As described above, the detection information S indicates a detection area in the operated member 11 where the electrostatic capacitance changes. Based on the detection information S, the processor 142 can determine a detection area in the operated member 11 where the finger 30 contacts or approaches. Specifically, when the difference between the electrostatic capacitance detected in a certain detection area and a reference electrostatic capacitance is not within a threshold range, the processor 142 determines that the finger 30 contacts or approaches the certain detection area.

For example, the processor 142 may be configured to change the reference electrostatic capacitance with a statistical value obtained from a plurality of electrostatic capacitances (including the latest electrostatic capacitance) detected a certain detection area for a prescribed time period. Examples of the statistical value include an average value, a median value, and a mode value.

The operated member 11 has a parasitic capacitance that fluctuates in accordance with environmental factors such as temperature and humidity. Accordingly, even if the operated member 11 is not operated with the finger 30, the electrostatic capacitance detected by the detection device 13 would change. Accordingly, the reference electrostatic capacitance in each detection area is changed in accordance with a change in the electrostatic capacitance caused by the fluctuation of the parasitic capacitance. For example, even while the operated member 11 is not operated, when the electrostatic capacitance is increased due to the fluctuation of the parasitic capacitance, the reference electrostatic capacitance is also changed to be increased.

The output interface 143 is configured as an interface for outputting control information C for controlling the operation of the controlled device 40. The processor 142 is configured to output the control information C from the output interface 143 based on the position in the operated member 11 at which the contact or approach of the finger 30 is detected. The control information C may be in the form of analog data or may be in the form of digital data. In a case where the control information C is in the form of analog data, the output interface 143 is configured to be equipped with an appropriate conversion circuit including a D/A converter.

For example, when it is detected that the finger 30 contacts or approaches the first detection area 111 based on the detection information S, the processor 142 outputs control information C for enabling one function of the controlled device 40 from the output interface 143. When it is detected that the finger 30 contacts or approaches the second detection area 112 based on the detection information S, the processor 142 outputs control information C for enabling another function of the controlled device 40 or one function of another controlled device 40 from the output interface 143.

Figure 3:
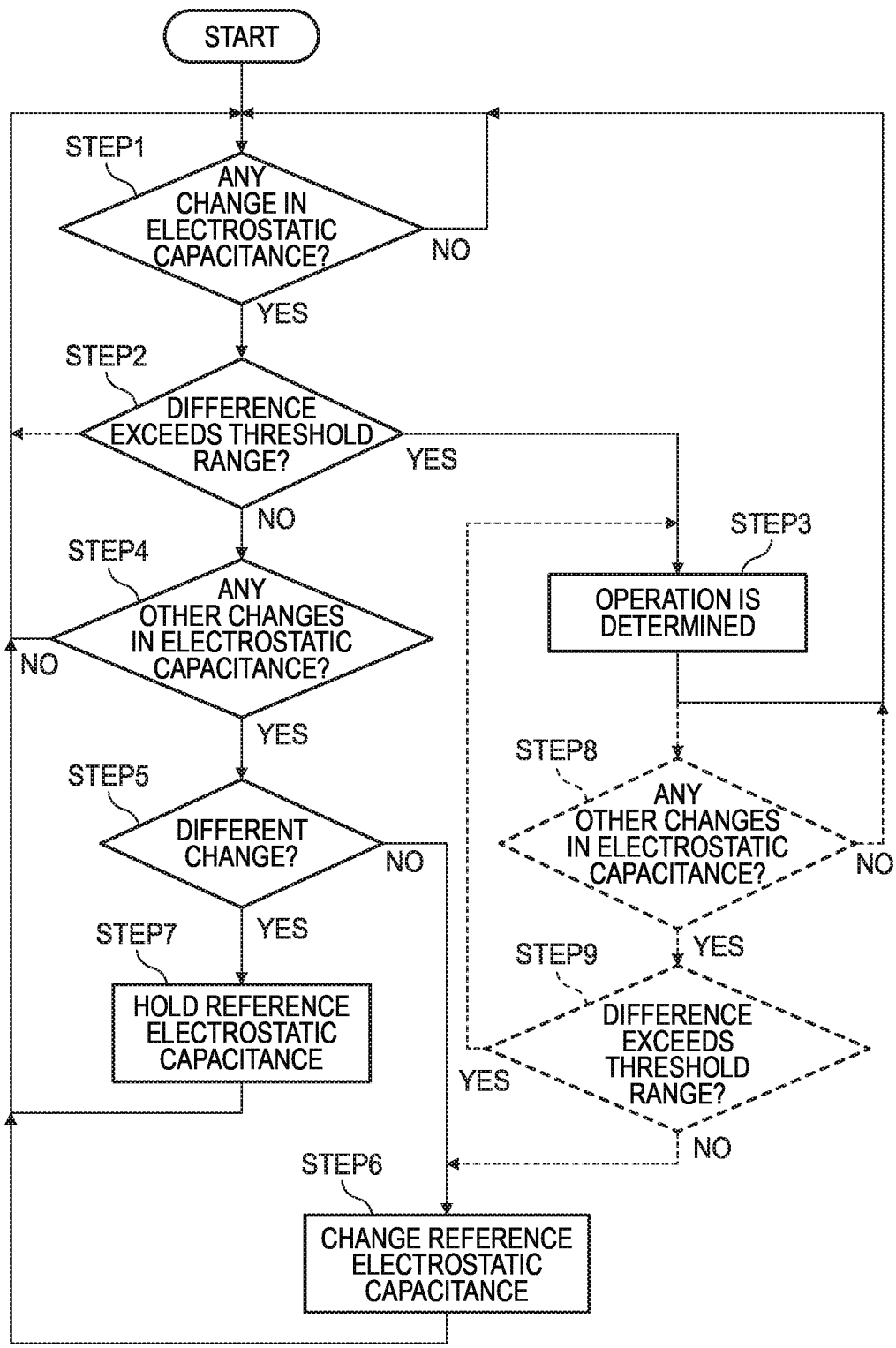
FIG. 3 illustrates a flow of processing executed by a control device of FIG. 1.

Referring to FIG. 3, a more specific flow of processing executed by the processor 142 of the control device 14 will be described.

When the processing is initiated, the processor 142 determines whether a change in the electrostatic capacitance is detected for a certain detection area based on the detection information S (STEP1). The determination is repeated until a change in the electrostatic capacitance is detected (NO in STEP1).

When a change in the electrostatic capacitance is detected in a certain detection area (YES in STEP1), the processor 142 determines whether the difference between the detected electrostatic capacitance and the reference electrostatic capacitance exceeds a threshold range (STEP2).

When it is determined that the difference between the detected electrostatic capacitance and the reference electrostatic capacitance exceeds the threshold range (YES in STEP2), the processor 142 determines that the operation with the finger 30 is performed to the certain detection area (STEP3). The processor 142 outputs the control information C associated with the operation from the output interface 143 to the controlled device 40. Thereafter, the processor 142 returns the processing to STEP1.

When it is determined that the difference between the detected electrostatic capacitance and the reference electrostatic capacitance does not exceed the threshold range (NO in STEP2), the processor 142 determines whether a change in the electrostatic capacitance is detected for any other detection areas (STEP4).

When no change in the electrostatic capacitance is detected for any other detection areas (NO in STEP4), the processor 142 returns the processing to STEP1.

When a change in the electrostatic capacitance of another detection area is detected (YES in STEP4), the processor 142 determines whether the changes in the electrostatic capacitance detected in both the detection areas are different from each other (STEP5).

When it is determined that the changes in the electrostatic capacitance detected in both the detection areas are not different from each other (NO in STEP5), the processor 142 changes the value of the reference electrostatic capacitance in accordance with the changes (STEP6). Thereafter, the processor 142 returns the processing to STEP1.

As used herein, the expression "the changes are not different from each other" or "the changes match each other" does not necessarily require that the changes to be compared are completely coincident with each other. As long as the degree of match between the changes to be compared is within a prescribed threshold value, the changes can be deemed to be "matched" or "not different from each other".

When it is determined that the changes in the electrostatic capacitance detected in both the detection areas are different from each other (YES in STEP5), the processor 142 holds the value of the reference electrostatic capacitance (STEP7). Thereafter, the processor 142 returns the processing to STEP1.

Figure 4:
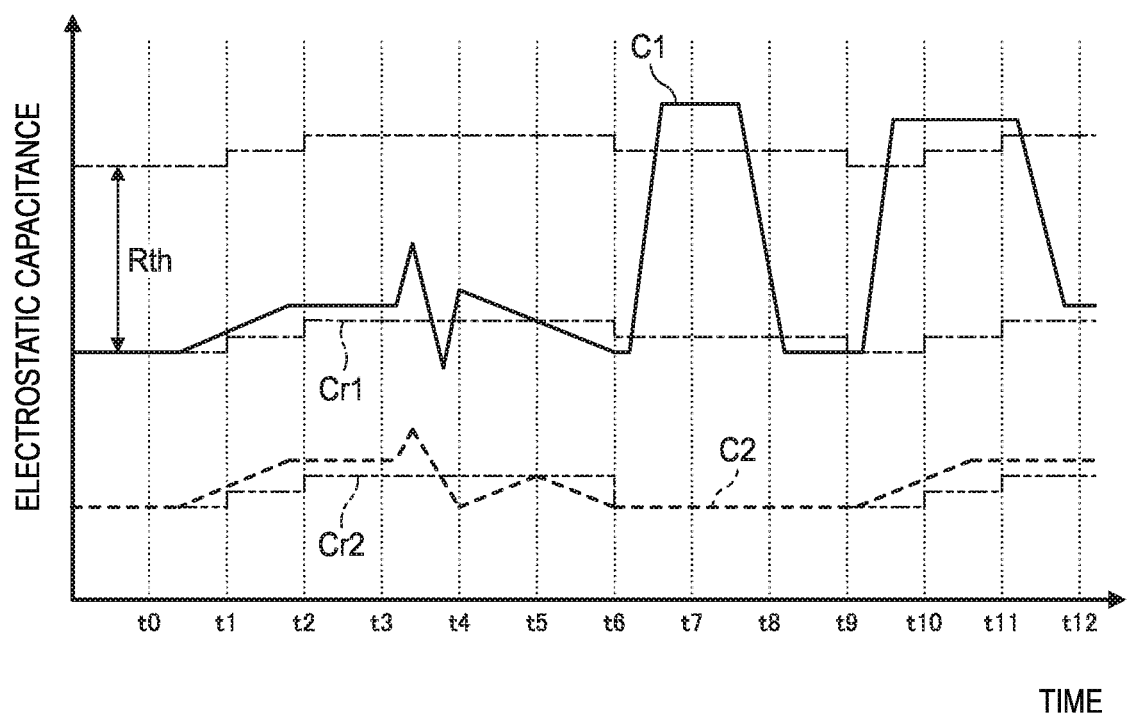
FIG. 4 illustrates an exemplary operation of the electrostatic sensor of FIG. 1.

FIG. 4 illustrates an exemplary operation of the electrostatic sensor 10 configured as described above. The solid line represents the electrostatic capacitance C1 between the operated member 11 and the first electrode 121 detected by the detection device 13. In the following descriptions, it will be simply referred to as "an electrostatic capacitance C1 in the first detection area 111". The dashed line represents the electrostatic capacitance C2 between the operated member 11 and the second electrode 122 detected by the detection device 13. In the following descriptions, it will be simply referred to as "an electrostatic capacitance C2 in the second detection area 112".

In FIG. 3, a chain line on the lower side represents a reference electrostatic capacitance Cr1 for the first detection area 111 set by the control device 14. The chain line on the upper side represents an upper limit value of the threshold range Rth determined in accordance with the reference electrostatic capacitance Cr1. The dashed chain line represents a reference electrostatic capacitance Cr2 for the second detection area 112 set by the control device 14. Although a similar threshold range is determined for the reference electrostatic capacitance Cr2, the illustration thereof is omitted here because, in this example, the difference between the electrostatic capacitance C2 and the reference electrostatic capacitance Cr2 does not exceed the threshold range.

At a time point t0, the electrostatic capacitance C1 for the first detection area 111 matches the reference electrostatic capacitance Cr1. Similarly, the electrostatic capacitance C2 related to the second detection area 112 matches the reference electrostatic capacitance Cr2. In the following descriptions, the first detection area 111 will be treated as an example of "a certain detection area" described above, and the second detection area 112 will be treated as an example of "another detection area" described above.

At a time point t1, a change in the electrostatic capacitance C1 in the first detection area 111 is detected (YES in STEP1 in FIG. 3). Accordingly, the processor 142 determines whether the difference between the electrostatic capacitance C1 and the reference electrostatic capacitance Cr1 exceeds the threshold range Rth (STEP2 in FIG. 3).

In this example, since the difference does not exceed the threshold range Rth (NO in STEP2 in FIG. 3), the processor 142 determines whether a change in the electrostatic capacitance C2 in the second detection area 112 is detected (STEP4 in FIG. 3).

In this example, since the change in the electrostatic capacitance C2 is also detected at the time point t1 (YES in STEP4 in FIG. 3), the processor 142 determines whether the change in the electrostatic capacitance C1 and the change in the electrostatic capacitance C2 are different from each other (STEP5 in FIG. 3).

In this example, since the electrostatic capacitance C1 and the electrostatic capacitance C2 are similarly increased (NO in STEP5 in FIG. 3), the processor 142 increases the reference electrostatic capacitance Cr1 (STEP6). The reference electrostatic capacitance Cr2 is also changed in the same manner.

Since a similar increasing tendency is observed in the electrostatic capacitance C1 and the electrostatic capacitance C2 at the time point t2, the processor 142 further increases the reference electrostatic capacitance Cr1 and the reference electrostatic capacitance Cr2.

At a time point t3, since the change in the electrostatic capacitance C1 is not detected (NO in STEP1 in FIG. 3), the value of the reference electrostatic capacitance Cr1 is not changed. The same applies to the electrostatic capacitance C2.

At a time point t4, a change in the electrostatic capacitance C1 is detected (YES in STEP1 in FIG. 3). However, since the difference between the electrostatic capacitance C1 and the reference electrostatic capacitance Cr1 does not exceed the threshold range Rth (NO in STEP2 in FIG. 3), the processor 142 determines whether a change in the electrostatic capacitance C2 in the second detection area 112 is detected (STEP4 in FIG. 3). In this example, a change in the electrostatic capacitance C2 is detected (YES in STEP4 in FIG. 3), but the change in the electrostatic capacitance C1 and the change in the electrostatic capacitance C2 are different from each other (YES in STEP5 in FIG. 3). Accordingly, the processor 142 holds the value of the reference electrostatic capacitance Cr1 (STEP7 in FIG. 3). Similarly, the value of the reference electrostatic capacitance Cr2 is held.

At a time point t5, a change in the electrostatic capacitance C1 is detected (YES in STEP1 in FIG. 3), and the difference from the reference electrostatic capacitance Cr1 does not exceed the threshold range Rth (NO in STEP2 in FIG. 3). On the other hand, a change in the electrostatic capacitance C2 is also detected (YES in STEP4 in FIG. 3), and both changes are different from each other (YES in STEP5 in FIG. 3). Accordingly, the processor 142 holds the value of the reference electrostatic capacitance Cr1 (STEP7 in FIG. 3). Similarly, the value of the reference electrostatic capacitance Cr2 is held.

At a time point t6, a change in the electrostatic capacitance C1 is detected (YES in STEP1 in FIG. 3), and the difference from the reference electrostatic capacitance Cr1 does not exceed the threshold range Rth (NO in STEP2 in FIG. 3). On the other hand, a change in the electrostatic capacitance C2 is also detected (YES in STEP4 in FIG. 3), and both changes match each other (NO in STEP5 in FIG. 3). Accordingly, the processor 142 changes the value of the reference electrostatic capacitance Cr1 (STEP6 in FIG. 3). Specifically, since the value of the electrostatic capacitance C1 decreases, the value of the reference electrostatic capacitance Cr1 is decreased. The reference electrostatic capacitance Cr2 is also changed in the same manner.

At a time point t7, a change in the electrostatic capacitance C1 is detected (YES in STEP1 in FIG. 3), and the difference from the reference electrostatic capacitance Cr1 exceeds the threshold range Rth (YES in STEP2 in FIG. 3). Accordingly, the processor 142 determines that the operation is performed to the first detection area 111 (STEP3 in FIG. 3). The value of the reference electrostatic capacitance Cr1 is not changed. On the other hand, since no change in the electrostatic capacitance C2 is detected, the value of the reference electrostatic capacitance Cr2 is held.

At a time point t8, a change in the electrostatic capacitance C1 is detected (YES in STEP1 in FIG. 3), and the difference from the reference electrostatic capacitance Cr1 does not exceed the threshold range Rth (NO in STEP2 in FIG. 3). On the other hand, no change in the electrostatic capacitance C2 is detected (NO in STEP4 in FIG. 3). Accordingly, the processor 142 holds the value of the reference electrostatic capacitance Cr1 and the value of the reference electrostatic capacitance Cr2.

At a time point t9, since the change in the electrostatic capacitance C1 is not detected (NO in STEP1 in FIG. 3), the value of the reference electrostatic capacitance Cr1 is not changed. The same applies to the electrostatic capacitance C2.

That is, the processor 142 of the control device 14 is configured not to change the reference electrostatic capacitance when different changes in the electrostatic capacitance are detected between the detection areas. As a result, it is possible to distinguish between a change in the electrostatic capacitance detected in accordance with a fluctuation in the parasitic capacitance caused by an environmental factor such as temperature or humidity and a change in the electrostatic capacitance detected in accordance with noise. Since the fluctuation in the parasitic capacitance caused by the environmental factor generally affects a plurality of detection areas in a similar manner, changes in the electrostatic capacitance of the plurality of detection areas to be detected exhibit a similar tendency. On the other hand, since noise rarely affects a plurality of detection areas in a similar manner, changes in the electrostatic capacitance of the plurality of detection areas to be detected are generally different from each other.

In the example illustrated in FIG. 4, the change in the electrostatic capacitance occurring between the time point t0 and the time point t2 as well as between the time point t5 and the time point t6 are based on the environmental factor. Accordingly, the change in the electrostatic capacitance C1 and the change in the electrostatic capacitance C2 are not different from each other. On the other hand, the change in the electrostatic capacitance occurring between the time point t3 to the time point t5 is caused by noise. Accordingly, the change in the electrostatic capacitance C1 and the change in the electrostatic capacitance C2 are different from each other. In such a case, by holding the value of the reference electrostatic capacitance, it is possible to suppress the occurrence of a situation that an inappropriate reference electrostatic capacitance is set based on a change in the electrostatic capacitance caused by noise, so that the determination as to whether an operation is performed is inaccurately made. Accordingly, it is possible to improve the operability of the electrostatic sensor equipped with the operated member having a plurality of detection areas.

As illustrated in FIG. 3, when it is determined that an operation is performed to a certain detection area (STEP3), the processor 142 may determine whether a change in the electrostatic capacitance is detected for any other detection areas (STEP8).

When no change in the electrostatic capacitance is detected for any other detection areas (NO in STEP8), the processor 142 returns the processing to STEP1.

When a change in the electrostatic capacitance of another detection area is detected (YES in STEP8), the processor 142 determines whether the difference between the detected electrostatic capacitance and the reference electrostatic capacitance exceeds a threshold range (STEP9).

When it is determined that the difference between the detected electrostatic capacitance and the reference electrostatic capacitance exceeds the threshold range (YES in STEP9), the processor 142 determines that the operation with the finger 30 is performed to another detection area (STEP3). The processor 142 outputs the control information C associated with the operation from the output interface 143 to the controlled device 40. Thereafter, the processor 142 returns the processing to STEP1.

When it is determined that the difference between the electrostatic capacitance detected for another detection area and the reference electrostatic capacitance does not exceed the threshold range (NO in STEP9), the processor 142 changes the value of the reference electrostatic capacitance for another detection area in accordance with the detected change in the electrostatic capacitance. The processor 142 also changes the value of the reference electrostatic capacitance of the certain detection area (STEP6). Thereafter, the processor 142 returns the processing to STEP1.

Referring to FIG. 4, an exemplary operation of the electrostatic sensor 10 configured as described above will be described. At a time point t10, a change in the electrostatic capacitance C1 is detected (YES in STEP1 in FIG. 3), and the difference from the reference electrostatic capacitance Cr1 exceeds the threshold range Rth (YES in STEP2 in FIG. 3). Accordingly, the processor 142 determines that the operation is performed to the first detection area 111 (STEP3 in FIG. 3).

At this time, the processor 142 determines whether a change in the electrostatic capacitance C2 in the second detection area 112 is detected (STEP8 in FIG. 3). In this example, since the change in the electrostatic capacitance C2 is also detected at the time point t10 (YES in STEP8 in FIG. 3), the processor 142 determines whether the difference between the electrostatic capacitance C2 and the reference electrostatic capacitance Cr2 exceeds the threshold range Rth (STEP9 in FIG. 3).

In this example, since the difference does not exceed the threshold range Rth (NO in STEP9 in FIG. 3), the processor 142 changes the reference electrostatic capacitance Cr2. Specifically, since the electrostatic capacitance C2 increases, the reference electrostatic capacitance Cr2 is increased. The reference electrostatic capacitance Cr1 is also changed in the same manner (STEP6 in FIG. 3).

Also at a time point t11, it is determined that the operation to the first detection area is performed, and a similar increasing tendency is observed in the electrostatic capacitance C2. Accordingly, the processor 142 further increases the reference electrostatic capacitance Cr1 and the reference electrostatic capacitance Cr2.

That is, in a case where a change in the electrostatic capacitance involving a change in the reference electrostatic capacitance is detected for another detection area while it is determined that an operation to a certain detection area is performed, the processor 142 may be configured to similarly change the reference electrostatic capacitance for the certain detection area.

The change in the electrostatic capacitance involving the change in the reference electrostatic capacitance means a change in the electrostatic capacitance detected in accordance with a fluctuation in the parasitic capacitance caused by an environmental factor such as temperature or humidity. As described above, since the fluctuation in the parasitic capacitance caused by the environmental factor generally affects a plurality of detection areas in a similar manner, changes in the electrostatic capacitance of the plurality of detection areas to be detected exhibit a similar tendency. Accordingly, the change in the reference electrostatic capacitance for another detection area that is made to compensate for the change in the electrostatic capacitance caused by the fluctuation in the parasitic capacitance can be similarly applied to the certain detection area. That is, even if a fluctuation in the parasitic capacitance is caused by the environmental factor such as temperature or humidity while an operation is performed to the certain detection area, it is possible to set an appropriate reference electrostatic capacitance for the certain detection area. In other words, it is possible to suppress the occurrence of a situation that an appropriate reference electrostatic capacitance is not set because of the fluctuation in the parasitic capacitance occurred while an operation is performed to the certain detection area, so that determination as to whether a next operation is performed is inaccurately made. Accordingly, it is possible to improve the operability of the electrostatic sensor equipped with the operated member having a plurality of detection areas.

When the processing including STEP8 and STEP9 in FIG. 3 is executed, the processing including STEP4, STEP5, and STEP6 in FIG. 3 may be omitted. In this case, when the difference between the electrostatic capacitance detected for the certain detection area and the reference electrostatic capacitance does not exceed the threshold range (NO in STEP2), the processor 142 returns the processing to STEP1.

The processor 142 having each function described above can be implemented by a general-purpose microprocessor operating in cooperation with a general-purpose memory. Examples of the general-purpose microprocessor include a CPU, an MPU, and a GPU. Examples of the general-purpose memory include a ROM and a RAM. In this case, a computer program for executing the above-described processing can be stored in the ROM. The ROM is an example of a non-transitory computer-readable medium having stored a computer program. The general-purpose microprocessor designates at least a part of the program stored in the ROM, loads the program on the RAM, and executes the processing described above in cooperation with the RAM. The above-described computer program may be pre-installed in a general-purpose memory, or may be downloaded from an external server via a communication network and then installed in the general-purpose memory. In this case, the external server is an example of the non-transitory computer-readable medium having stored a computer program.

The processor 142 may be implemented by a dedicated integrated circuit capable of executing the above-described computer program, such as a microcontroller, an ASIC, and an FPGA. In this case, the above-described computer program is pre-installed in a memory element included in the dedicated integrated circuit. The memory element is an example of the non-transitory computer-readable medium having stored a computer program. The processor 142 may also be implemented by a combination of a general-purpose microprocessor and a dedicated integrated circuit.

The above embodiments are merely illustrative for facilitating understanding of the presently disclosed subject matter. The configuration according to the above embodiment can be appropriately modified or improved without departing from the gist of the presently disclosed subject matter.

In the above embodiment, the operated member 11 has two detection areas. However, the number of the detection areas may be three or more. The position, shape, size, and type of operation that can be accepted of each detection area in the operated member 11 can be appropriately determined according to the function of the controlled device 40 to be controlled.

In the above embodiment, a single first electrode 121 is associated with the first detection area 111 of the operated member 11, and a single second electrode 122 is associated with the second detection area 112 of the operated member 11. However, a plurality of first electrodes 121 may be associated with the first detection area 111. In this case, it is possible to detect a position where the finger 30 contacts or approaches the first detection area 111 in more detail. Similarly, a plurality of second electrodes 122 may be associated with the second detection area 112. In this case, it is possible to detect a position where the finger 30 contacts or approaches the second detection area 112 in more detail.

In the above embodiment, the electrostatic capacitance between the operated member 11 and the finger 30 of the occupant is detected. As long as a change in the electrostatic capacitance caused by an operation performed to the operated member 11 can be detected, the operation may be performed with another body part, or with clothing or a tool interposed between the body part and the operated member 11.

The electrostatic sensor 10 may be installed in a mobile entity other than the vehicle 20. Examples of the mobile entity include railways, aircraft, and ships. The mobile entity may not require a driver. The electrostatic sensor 10 may be installed in a mobile device capable of being carried by a user. A mobile device is also an example of a mobile entity. When the electrostatic sensor 10 is provided in such a mobile entity, a part of the user's body tends to contact or approach an undesired detection area due to the movement or vibration of the mobile entity. Accordingly, the utility of the electrostatic sensor 10 having the configuration as described above is further enhanced.

The electrostatic sensor 10 need not be installed in a mobile entity. As long as the operation of the controlled device 40 can be controlled through an operation performed to the operated member 11, the illustrated configuration can be applied to any application, such as a stationary device, a building such as a house or a facility.

The present application is based on Japanese Patent Application No. 2020-106256 filed on Jun. 19, 2020, the entire contents of which are incorporated herein by reference.

What is claimed is:

1. An electrostatic sensor, comprising:
   a detector configured to detect an electrostatic capacitance between an operated member having a plurality of detection areas and an electrode having areas associated with the detection areas, respectively; and
   a controller configured to determine that an operation is performed to each of the detection areas in a case where a difference between the electrostatic capacitance and a reference electrostatic capacitance exceeds a threshold range,
   wherein the controller is configured to change the reference electrostatic capacitance in a case where it is determined that an operation is not performed to one of the detection areas, but same changes in the electrostatic capacitance are detected between the detection areas; and
   wherein the controller is configured to hold the reference electrostatic capacitance in a case where it is determined that an operation is not performed to one of the detection areas, but different changes in the electrostatic capacitance are detected between the detection areas.

2. An electrostatic sensor, comprising:
   a detector configured to detect an electrostatic capacitance between an operated member having a plurality of detection areas and an electrode having areas associated with the detection areas, respectively; and
   a controller configured to determine that an operation is performed to each of the detection areas in a case where a difference between the electrostatic capacitance and a reference electrostatic capacitance is greater than a threshold range,
   wherein the controller is configured to, in a case where it is determined that an operation is performed to a first one of the detection areas, determine whether an operation is performed to a second one of the detection areas; and wherein the controller is configured to change the reference electrostatic capacitance for the first one of the detection areas in a case where it is determined that an operation is not performed to the second one of the detection areas.

3. The electrostatic sensor according to claim 2, wherein in a case where different changes in the electrostatic capacitance are detected between the detection areas, the controller holds the reference electrostatic capacitance.

4. The electrostatic sensor according to claim 1, being configured to be installed in a mobile entity.

5. The electrostatic sensor according to claim 2, being configured to be installed in a mobile entity.

6. A controller configured to control an operation of an electrostatic sensor equipped with an operated member having a plurality of detection areas, comprising:
   a reception interface configured to receive detection information corresponding to an electrostatic capacitance between the operated member and an electrode having areas associated with the detection areas, respectively; and
   a processor configured to determine that an operation is performed to each of the detection areas in a case where a difference between the electrostatic capacitance and a reference electrostatic capacitance exceeds a threshold range,
   wherein the processor is configured to change the reference electrostatic capacitance in a case where it is determined that an operation is not performed to one of the detection areas, but same changes in the electrostatic capacitance are detected between the detection areas; and
   wherein the processor is configured to hold the reference electrostatic capacitance in a case where it is determined that an operation is not performed to one of the detection areas, but different changes in the electrostatic capacitance are detected between the detection areas.

7. A controller configured to control an operation of an electrostatic sensor equipped with an operated member having a plurality of detection areas, comprising:
   a reception interface configured to receive detection information corresponding to an electrostatic capacitance between the operated member and an electrode having areas associated with the detection areas, respectively; and
   a processor configured to determine that an operation is performed to each of the detection areas in a case where a difference between the electrostatic capacitance and a reference electrostatic capacitance exceeds a threshold range,
   wherein the processor is configured to, in a case where it is determined that an operation is performed to a first one of the detection areas, determine whether an operation is performed to a second one of the detection areas; and
   wherein the processor is configured to change the reference electrostatic capacitance for the first one of the detection areas in a case it is determined that an operation is not performed to the second one of the detection areas.

8. A non-transitory computer-readable medium having stored a computer program adapted to be executed by a processor installed in a controller configured to control an operation of an electrostatic sensor equipped with an operated member having a plurality of detection areas, the computer program being configured to cause, when executed, the controller to:
   receive detection information corresponding to an electrostatic capacitance between the operated member and an electrode having areas associated with the detection areas, respectively;
   determine that an operation is performed to each of the detection areas in a case where a difference between the electrostatic capacitance and a reference electrostatic capacitance exceeds a threshold range;
   change the reference electrostatic capacitance in a case where it is determined that an operation is not performed to one of the detection areas, but same changes in the electrostatic capacitance are detected between the detection areas; and
   hold the reference electrostatic capacitance in a case where it is determined that an operation is not performed to one of the detection areas, but different changes in the electrostatic capacitance are detected between the detection areas.

9. A non-transitory computer-readable medium having stored a computer program adapted to be executed by a processor installed in a controller configured to control an operation of an electrostatic sensor equipped with an operated member having a plurality of detection areas, the computer program being configured to cause, when executed, the control device to:
   receive detection information corresponding to an electrostatic capacitance between the operated member and an electrode having areas associated with the detection areas, respectively;
   determine that an operation is performed to each of the detection areas in a case where a difference between the electrostatic capacitance and a reference electrostatic capacitance exceeds a threshold range;
   in a case where it is determined that an operation is performed to a first one of the detection areas, determine whether an operation is performed to a second one of the detection areas; and
   change the reference electrostatic capacitance for the first one of the detection areas in a case where it is determined that an operation is performed to the second one of the detection areas.

* * * * *